United States Patent [19]

Horner et al.

[11] Patent Number: 5,194,316
[45] Date of Patent: Mar. 16, 1993

[54] LAMINAR POLYMERIC SHEET

[75] Inventors: Patrick J. Horner; Michael J. Ludden; Peter Nyholm, all of Swindon; Nicholas J. G. Smith, Cricklade; Richard J. Penneck, Lechlade, all of England

[73] Assignee: Raychem Limited, United Kingdom

[21] Appl. No.: 548,961

[22] PCT Filed: Feb. 3, 1989

[86] PCT No.: PCT/GB89/00108
§ 371 Date: Feb. 26, 1991
§ 102(e) Date: Feb. 26, 1991

[87] PCT Pub. No.: WO89/07336
PCT Pub. Date: Aug. 10, 1989

[30] Foreign Application Priority Data

Feb. 5, 1988 [GB] United Kingdom ................ 8802566
Dec. 2, 1988 [GB] United Kingdom ................ 8828245

[51] Int. Cl.$^5$ ............................................. B32B 9/00
[52] U.S. Cl. ..................................... 428/195; 428/137; 428/209; 428/411.1; 428/473.5; 428/474; 428/901

[58] Field of Search ................. 428/137, 209, 411.1, 428/473.5, 474.4, 901

[56] References Cited

FOREIGN PATENT DOCUMENTS 0048221 3/1982 European Pat. Off. .
0059434 9/1982 European Pat. Off. .
0072673 2/1983 European Pat. Off. .
0095048 11/1983 European Pat. Off. .
0213774 3/1987 European Pat. Off. .
0218796 4/1987 European Pat. Off. .

Primary Examiner—Patrick J. Ryan
Assistant Examiner—W. Krynski
Attorney, Agent, or Firm—Herbert G. Burkard; Sheri M. Novack

[57] ABSTRACT

A sheet laminate of polyimide and amorphous polyamide especially suitable for making anisotropically electrically conductive articles by laser abiation drilling followed by metal plating. Preferred polyimides include those derived from polymerization of 4,4'biphenyldianhydride and 4,4'-diaminobiphenylether or p-phenylenediamine. Preferred amorphous polyamides include those derived from condensation of terephthalic acid with isomers of trimethylhexamethylenediamine.

24 Claims, No Drawings

LAMINAR POLYMERIC SHEET

This invention relates to a laminar polymer sheet and to products made from such a sheet.

Published EP-A-0213774 describes methods of making uniaxially electrically conductive articles by making through-holes in a laminar polymer sheet, plating metal in the holes, and removing surface laminae from the sheet to leave the plated metal in each through-hole projecting beyond the main surfaces of the sheet. These conductive articles are commerically valuable as compliant electrical connection interfaces, for example for connecting microcircuit chips to other elements in an electronic device. The through-holes can be made conveniently small (preferably not more than 200 micrometers diameter) and may be close-packed so that random positioning of the article between opposed connection sites produces electrical connection when the sites are brought into contact with the opposite main surfaces of the article. Other forms of such articles are described in copending British Patent Applications 8802567, 8802565, 8802568, 8815447.1, 8819895.7, and 8823053.7, the disclosures of all of which are incorporated herein by reference.

In view of the wide use of polyimide materials in microelectronic devices, it is desirable to use polyimides for the uniaxially conductive articles, but this leads to problems in selecting suitable materials for the removable surface laminae.

The present invention relates to a novel laminar structure which is useful for various purposes, and is especially advantageous for making the aforementioned uniaxially conductive articles.

The invention accordingly provides a laminar sheet comprising a layer of polyimide material laminated in direct contact with a layer of amorphous, preferably amorphous aromatic, polyamide material.

It will be understood that references to sheets include elongate tape-like sheets and other forms of substantially continuous laminar structures, in which individual laminae are preferably homogeneous. For the purpose of making the aforesaid uniaxially electrically conductive sheets, it is preferable to use a sheet with each of the two main surfaces of the layer of polyimide material laminated in direct contact with a layer of aromatic polyamide material. It may be convenient in many cases that the polyimide layer is substantially co-extensive with the polyamide layer(s).

References to the respective layers being "laminated" do not imply any particular method of making the laminar structure. Solvent casting or melt coating of one material onto the other may be used, for example, as an alternative to lamination of two pre-existing solid films, provided that the desired laminar structure is achieved. For solvent casting, many solvents and solvent blends can be used including, for example:

n-methyl pyrrolidone/10% methanol blend
methanol/chloroform blend
dimethyl formamide (DMF)
dimethyl acetamide (DMAC).

If desired, small quantities of additives (e.g. UV absorbing chromophores such as aromatic carbonyl compounds, e.g. benzophenone) can be included.

Preferred amorphous polyamides include aliphatic-/aromatic polyamides, (A) polyamides based on the condensation of terephthalic acid with trimethylhexamethylene diamine (preferably containing a mixture of 2,2,4- and 2,4,4-trimethylhexamethylene diamine isomers), (B) polyamides formed from the condensation of one or more bisaminomethylnorbornane isomers with one or more aliphatic, cycloaliphatic or aromatic dicarboxylic acids e.g. terephthalic acid and optionally including one or more amino acid or lactam e.g. epsilon-caprolactam comonomers, (C) polyamides based on units derived from laurinlactam, isophthalic acid and bis-(4-amino-3-methylcyclohexyl) methane, (D) polyamides based on the condensation of 2,2-bis-(p-aminocyclohexyl) propane with adipic and azeleic acids, and polyamides based on the condensation of trans cyclohexane-1,4-dicarboxylic acid with the trimethylhexamethylene diamine isomers mentioned above.

(E) polyamides based on units derived from m-xylylenediamine and adipic acid.

Other preferred polyamides include those based on polyether and polyamide blocks, especially the so called "polyether-ester amide block copolymers" of repeating unit:

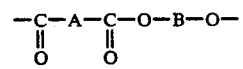

wherein A represents a polyamide sequence of average molecular weight in the range of from 300 to 15,000, preferably from 800 to 5000; and B represents a linear or branched polyoxyalkylene sequence of average molecular weight in the range of from 200 to 6000, preferably from 400 to 3000.

Preferably the polyamide sequence is formed from alpha, omega-aminocarboxylic acids, lactams or diamine/dicarboxylic acid combinations having $C_4$ to $C_{14}$ carbon chains, and the polyoxyalkylene sequence is based on ethylene glycol, propylene glycol and/or tetramethylene glycol, and the polyoxyalkylene sequence constitutes from 5 to 85%, especially from 10 to 50% of the total block copolymer by weight. These polymers and their preparation are described in UK Patent Specifications Nos. 1,473,972, 1,532,930, 1,555,644, 2,005,283A and 2,011,450A, the disclosures of which are incorporated herein by reference.

The polymer preferably has a C:H ratio of not more than 0.9, more preferably not more than 0.75, most preferably not more than 0.65 and especially not more than 0.55.

It is notoriously difficult to cross-link polyamides, but it has been found unexpectedly that these amorphous polyamides can be cross-linked by exposure to laser light at power levels which are insufficient to perforate or ablate the polymer. At higher powers, exposure to laser light can be used to perforate or ablate the polymer to produce through-holes for making the uniaxially conductive article as aforesaid. Laser light at a wavelength greater than 248 nanometers is preferred, preferably from an excimer laser, especially a KrF excimer laser (249 nm) for perforation, or an XeCl excimer laser (308 nm) for crosslinking.

The methods, material and dimensions described in the aforementioned EP-A-0213774 can be used to form through-holes and to put electrically conductive material in the holes, to produce sheets having through-holes containing electrically conductive material which provides an electrically conductive path between the main surfaces of the sheet. Preferably, the electrically conductive material providing the conductive path comprises metal plated on the interior surface of the through-holes, and preferably each such conductive path is electrically separate from substantially all the other such paths. The invention includes the preferred uniaxially electrically conductive article produced by removal of at least part of the polyamide layer(s) from the surface(s) of such a sheet so as to leave the electrically conductive material in the through-holes projecting beyond the main surface(s) of the sheet. Substantially complete removal of the polyamide layer(s) is preferred. The disclosures of EP-A-0213774 and of the aforesaid copending application are accordingly incorporated herein by reference.

It is an advantage of this invention that the polyamides adhere tenaciously to the polyimide, are readily and cleanly laser-drillable at the preferred wavelengths, and are readily removable by suitable solvents when desired.

The unexpectedly good adhesion of the polyamides to the notoriously difficult-to-adhere polyimides enables the laminar sheet to be used as an electrically insulating covering of a wire, with advantages over known polyimide-insulated wires.

Preferred polyimides include, for example, those commonly used in printed circuit boards or other components of electronic devices; those described in EP-A-0178185, the disclosure of which is incorporated herein by reference; and especially those resulting from polymerisation of 4,4'-biphenyldianhydride and (4,4'-diaminobiphenyl, 4,4'-diaminobiphenylether or phenylene diamine), preferably p-phenylenediamine.

The laminate sheet may carry at least one further layer of polymeric material overlying at least one layer of polyamide material, and/or may carry at least one metallic layer overlying at least one polyamide layer. For example, acrylates, methacrylates, cellulose esters or other lacquers, mould release agents, and any other polymer coatings may be used as the further layer provided the material used has adequate adhesion to the polyamide.

A sheet comprising the layer of polyimide material having a layer of the polyamide material on one or both of its main surfaces, and a metallic layer on the, or one, or both, polyamide layer(s) may be especially useful in making flexible circuitry.

Specific examples of the invention will now be described by way of further illustration.

EXAMPLE 1

Production of a Laminate

Three laminates, respectively consisting of a sheet of the polyimide materials mentioned above derived from 4,4'-biphenyldianydride and (1a) 4,4'-diaminodiphenyl (1b) 4,4'-diaminobiphenylether, (c) p-phenylenediamine coated on both sides with amorphous aromatic polyamide (A) were prepared by solution coating. A solution, approximately 20% by weight, was obtained by dissolving the polyamide in DMF.

A layer of the polyamide (A) hereinbefore mentioned in DMF was coated onto one side of the polyimide by doctor blading (other methods can also be used, e.g. spiral bar coating, spin coating). It was noted that there was no tendency of the single-sided laminate to curl on drying. Once the film was dry to the touch, the other side was coated in a similar manner. The completed three-layer laminate was subsequently dried in an oven at 150° C. for one hour to remove all traces of residual solvent. The final polyamide thickness can be controlled by the polymer solution concentration and the height of the doctor blade.

The finished laminate was then assessed for adhesion by peel testing. The adhesive bond was found to be so good that it was impossible to separate the polyamide layers from the polyimide without tearing the polyamide film. Similar results were achieved using the polyamide (C) hereinbefore mentioned instead of polyamide (A).

In contrast, a film of polyetherimide (Ultem, a General Electric polymer) cast from dichloromethane onto the polyimide layer showed surprisingly poor adhesion, despite the apparent chemical similarity of the two polymers. The whole coated film peeled and completely delaminated a short time after drying, even without heating.

EXAMPLE 2

Wire Coating

Primary wires insulated with polyamide/polyimide composite can be produced by a variety of means:

(a) A three-layer polyamide/polyimide/polyamide laminate, produced as described in Example 1, can be cut into strips about 1 cm wide, and these strips spirally wrapped round conventional conductors (with some overlap) using well-known means. The insulated wire is then heated beyond the softening temperature of the polyamide to consolidate the insulation, and bind the wraps together.

(b) A copper conductor may be spirally wrapped with polyimide tape, dip coated with a solution of amorphous aromatic polyamide, and passed through a sizing die. The wire is then passed through a heated drying zone to remove excess solvent, producing a finished insulated primary wire.

(c) A copper conductor may be spirally wrapped with polyimide tape, and then passed through the head of a conventional extruder to extrude a layer of aromatic polyamide onto the wrapped conductor, and cooled in a water bath to finish the wire.

EXAMPLE 3

Adhesive Layer

A solution of amorphous polyamide as described in Example 1 was used to form an adhesive layer between two pieces of polyimide film. The solution was applied to the film using a brush, though the coating techniques described in Example 1 could also be used. The second layer of polyimide was placed in contact with the wet adhesive layer and the 'sandwich' pressed together and heated to dry the solution. The sandwich was baked to remove traces of residual solvent and a bonded laminate of polyimide to polyimide was formed via the amorphous aromatic polyamide. This process can be repeated to form a multi-layer structure, which could subsequently be machined to shape. As an example of machining, a multi-layer sandwich was drilled with an ultraviolet excimer laser to produce 100 micron diameter through-holes.

EXAMPLE 4

UV Excimer Laser Crosslinking

A wire insulated with polyamide/polyimide composite was prepared as described in Example 2(a), and subsequently crosslinked by UV excimer laser light. This was achieved by irradiating the wire with laser light from a Lambda Physik XeCl excimer laser (wavelength=308 nm). This laser produces pulses of UV light of about 30 ns duration, each pulse containing about 300 mJ. The laser beam was shaped using lenses and mirrors of types well known in the art so that lengths of wire were irradiated on all sides at an incident fluence of about 10 mJ/cm$^2$/pulse for about 20 pulses. Because the laser can be pulsed repetitively at 100 Hz or more, it is possible to build a wire handling system that passes wire continuously through the crosslinking zone.

The polyamide/polyimide-insulated wire so produced was compared with similar wire that had not been laser treated. Lengths of the insulated wires were placed in warm dimethylformamide (DMF). It was found that the aromatic polyamide part of the untreated wire rapidly dissolved, leading to delamination of the insulation. In contrast, the laser-treated sample demonstrated superior solvent resistance. Microscopic examination showed that the aromatic polyamide had not been dissolved, indicating that crosslinking had indeed occurred.

EXAMPLE 5

Drilling, Plating & Surface Removal (a) A laminate produced according to Example 1c, with benzophenone added as a chromophore at a level of 0.1% based on the weight of polyamide, was subjected to laser ablation using an XeCl excimer laser at a wavelength of 308 nm to produce a multitude of through-holes of about 50 micrometers diameter, which were electrolessly plated with copper, then nickel, then gold using known electroless plating baths, followed by removal of the polyamide surface layers from the sheet, all using the methods described in the aforementioned EP-A-0213774.

(b) The laminate used for (a) above was subjected to laser ablation using an KrF excimer laser at a wavelength of 249 nm to produce a "1:1" pattern of through-holes (as described in the aformentioned copending British application) of about 50 micrometers diameter. The holes were electrolessly plated with copper, then nickel, then gold using known plating baths, followed by removal of the polyamide surface layers from the sheet to produce a "1:1" uniaxially electrically conductive article of the kind described in the aforementioned copending British application.

(c) The procedures (a) and (b) were repeated to produce respectively a "multi-tube" article as in (a) and a "1:1" article as in (b) but with through-holes of only 10 micrometers diameter containing the projecting plated metal. A closely spaced regular "1:1" array of this kind can be especially useful for making connections to high-density regular arrays of electronic devices.

Preferred polyimide materials for the present invention are those which are capable of retaining at least 50%, preferably at least 75%, more preferably at least 85%, of its original elongation after immersion in water of pH10 at 100° C. for 4 days according to ASTM D882. It will be readily understood that a sufficiently fully cyclised polyimide having less than 15%, preferably less than 10%, more preferably less than 5%, or if possible substantially no open imide rings or uncyclised amic acid groupings may be better able to survive hot alkaline metal plating baths, which attack known polyimides such as Kapton (TM). The use of the aforesaid preferred polyimides derived from 4,4'-biphenyldianhydride has been found advantageous both in general and for the anisotropically electrically conductive articles described and claimed in the aforementioned EP-A-0213774, which accordingly represents another inventive aspect, various features of which will be understood from the following numbered paragraphs.

P1. An anisotropically electrically conductive article comprising porous electrically insulating polyimide sheet material at least a selected portion of which has at least 25 substantially non-interconnected pores per square millimeter of its surface, at least a significant proportion of which pores individually contain electrically conductive material which provides an electrically conductive path between, and projects beyond at least one of, the main surfaces of the sheet material, each such conductive path being electrically separate from substantially all the other such conductive paths, and the polyimide being derived from polymerisation of 4,4'-biphenyl dianhydride and (4,4'-diaminobiphenyl or 4,4'-diaminobiphenyl ether, or phenylene diamine) and/or being capable of retaining at least 50%, preferably at least 75%, more preferably at least 85% of its original elongation after immersion in water of pH10 at 100° C. for 4 days according to ASTM D882.

P2. An anisotropically electrically conductive article comprising porous electrically insulating polyimide sheet material at least a selected portion of which has at least 25 substantially non-interconnected pores per square millimeter of its surface, at least a significant proportion of which pores are internally plated with electrically conductive material, and the electrically conductive material provides an electrically conductive path between the main surfaces of the sheet material and each such path is electrically separate from substantially all the other such paths, and the polyimide being derived from polymerisation of 4,4'-biphenyl dianhydride and (4,4'-diaminobiphenyl or 4,4'-diaminobiphenylether, or phenylene diamine) and/or being capable of retaining at least 50%, preferably at least 75%, more preferably at least 85% of its original elongation after immersion in water of pH10 at 100° C. for 4 days according to ASTM D882.

P3. An anisotropically electrically conductive article comprising porous electrically insulating polyimide sheet material at least a selected portion of which has a plurality of substantially non-interconnected pores at least a significant proportion of which pores individually contain a tubular first portion of electrically conductive material, which tubular material projects beyond at least one of the main surfaces of the sheet material, and the polyimide being derived from polymerisation of 4,4'-biphenyl dianhydride and (4,4'-diaminobiphenyl or 4,4'-diaminobiphenylether, or phenylenediamine) and/or being capable of retaining at least 50%, preferably at least 75%, more preferably at least 85% of its original elongation after immersion in water of pH10 at 100° C. for 4 days according to ASTM D882.

P4. An article according to paragraph 3, wherein the electrically conductive material provides an electrically conductive path between the main surfaces of the sheet material and each such path is electrically separate from substantially all the other such paths.

P5. An article according to paragraph 2, wherein the conductive material projects beyond at least one of the main surfaces of the sheet material.

P6. An article according to any preceding paragraph, wherein the sheet material has 25 to 2000 pores per square millimetre in the selected portion of its surface.

P7. An article according to any preceding paragraph, wherein the conductive material in at least some of the said pores comprises a tubular first portion of electrically conductive material in contact with the pore interior surface, and a second portion of material in contact with the interior surface of the tube provided by the first portion.

P8. An article according to paragraph 7, wherein the second portion of material is also tubular.

P9. An article according to paragraph 7 or 8, wherein the material of the said second portion is different from the electrically conductive material of the said first portion.

P10. An article according to paragraph 7, 8, or 9, wherein electrically conductive metal, fusible alloy or solder is within the tube provided by the tubular electrically conductive material.

P11. An article according to any preceding paragraph, wherein the conductive material in at least some of the said pores comprises a first portion of electrically conductive material in contact with the interior pore surface, and a second portion of electrically conductive material on at least one of the end surfaces of the first portion, the second portion projecting beyond at least one of the sheet surfaces.

P12. An article according to any preceding paragraph, wherein the said pores have a toruosity less than 3, preferably less than 1.2.

P13. An article according to any preceding paragraph, wherein electrically insulating material has been removed from one or both main surfaces of the sheet material to expose portions of the electrically conductive material originally within the pores.

P14. An article according to any preceding paragraph, wherein the electrically insulating sheet material includes a closed cell porous structure in addition to the said pores containing the electrically conductive material.

P15. A method of making an article according to any paragraph 7 to 11, comprising:

(a) applying the said first portion of electrically conductive material to the interior surface of the pores in at least a selected portion of an appropriate porous electrically insulating sheet material, (b) removing any electrically conductive material from at least selected areas of the opposed main surfaces of the sheet material, and (c) applying the said second portion of material to at least part of the surface of the first portion.

P16. A method of making an article according to paragraph 13, comprising:

(a) applying the electrically conductive material to the interior surface of the pores in at least a selected portion of an appropriate porous electrically insulating sheet material, and (b) removing electrically insulating material from one of both main surfaces of the sheet material so as to expose portions of the electrically conductive material originally within the pores.

P17. An electrical device or assembly process in which one or more temporary or permanent electrical connections are made by contact with the opposite ends of the electrically conductive material located in the pores of an article according to any of paragraph 1 to 14.

P18. A process for testing semiconductive integrated circuit chips, wherein testing circuitry is temporarily electrically connected to an unbonded chip by contact of connection sites of the testing circuitry and the chip respectively with opposite ends of the electrically conductive material located in the pores of an article according to any of paragraph 1 to 14.

P19. An article, method, device, or process according to any of paragraphs 1 to 18, wherein the polyimide is derived from 4,4'-biphenyldianhydride and p-phenylenediamine.

The currently more preferred commercially available polyimides are those available under the Trade Mark "UPILEX" from Ube/ICI. One of these, "UPILEX R", is believed to be a relatively completely cyclised polymer having a repeat unit derived from biphenyl dianhydride and diaminodiphenylether, viz.

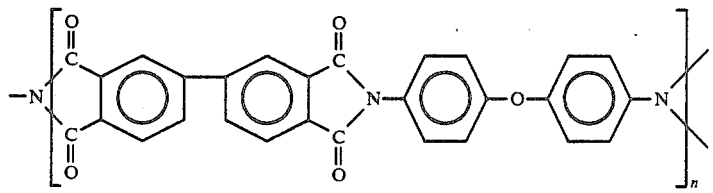

Most preferred, however, is "UPILEX S", which is believed to have a repeat unit derived from the same anhydride and phenylene diamine, viz.

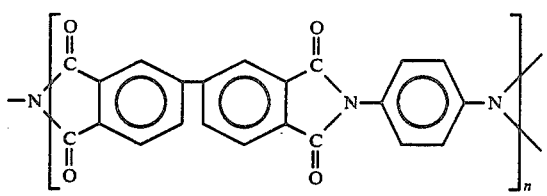

The polyimide derived from the biphenyldianhydride and 4,4'-diaminobiphenyl may have thermal expansion characteristics which are particularly well suited to microcircuit requirements. The corresponding polymers derived from isomers of the diamines mentioned above, e.g. the 3,4'- or 3,3'-diamino isomers may also be useful, as may the corresponding polymers derived from pyromellitic dianhydride instead of the biphenyldianhydride (but excluding Kapton, of course).

For the through-holes previously mentioned, laser drilling, preferably by ablative photodecomposition using a U.V. excimer laser, has the advantage of producing through-holes with less pronounced taper than alternative chemical etching methods, the lower degree of taper permitting closer pitch (hole-to-hole spacing). This is clearly advantageous, given that microcircuits, with which the resulting anisotropically conductive (after metal plating of the through-holes) sheets may be used, are becoming progressively smaller and more densely patterned. Through-holes with taper (measured on the substantially straight inner portions of the holes) less than 10°, preferably less than 8°, more preferably less than 6°, and especially less than 4° (relative to the axis of the through-hole) can advantageously be achieved by laser drilling of the laminates according to the present invention. This is especially useful for the generally preferred holes of less than 200 micrometers diameter, e.g. 5 to 150 micrometers or 10 to 100 micrometers, and especially less than 50 micrometers diameter.

We claim:

1. A laminar sheet comprising a layer of polyimide material laminated in direct contact with a layer of amorphous polyamide material.

2. A sheet according to claim 1 wherein the polyamide material comprises amorphous aromatic polyamide material.

3. A sheet according to claim 1, wherein each of the two main surfaces of the layer of polyimide material is laminated in direct contact with a layer of the polyamide material.

4. A sheet according to claim 1, wherein the polyimide layer is substantially co-extensive with the polyamide layer(s).

5. A sheet according to claim 1, which has been cross-linked by exposure to UV light.

6. A sheet according to claim 5 which has been selectively cross-linked to form a resist pattern.

7. A sheet according to claim 1, in which through-holes have been produced by exposure of selected areas of the sheet to U.V. laser light.

8. A sheet according to claim 1, having through-holes containing electrically conductive material which provides an electrically conductive path between the main surfaces of the sheet.

9. A sheet according to claim 8, wherein the electrically conductive material providing each conductive path comprises metal plated on the interior surface of the through-holes.

10. A sheet according to claim 8, wherein each such conductive path is electrically separate from substantially all the other such paths.

11. A sheet produced by removal of at least part of the polyamide layer(s) from the surface(s) of the polyimide layer of a sheet according to claim 8, so as to leave the electrically conductive material in the through-holes projecting beyond the resulting main surface(s) of the sheet.

12. A sheet according to claim 11 following substantially complete removal of the polyamide layer(s).

13. A sheet according to any of claim 1, in the form of an electrically insulating covering of an electrical wire.

14. A sheet according to claim 1, wherein the polyamide is derived from
(A) the condensation of terephthalic acid with at least one isomer of trimethylhexamethylene diamine (preferably containing a mixture of 2,2,4-and 2,4,4- trimethylhexamethylene diamine isomers), or
(B) the condensation of one or more bisaminomethyl-norbornane isomers with one or more aliphatic, cycloaliphatic or aromatic dicarboxylic acids and optionally includes one or more amino acid or lactam e.g. epsilon-caprolactam comonomers, or
(C) laurinlactam, isophthalic acid and bis-(4-amino-3-methylcyclohexyl) methane, (D) the condensation of 2,2-bis-(p-aminocyclohexyl) propane with adipic and azeleic acids, or the condensation of trans cyclohexane-1,4-dicarboxylic acid with the trimethylhexamethylene diamine isomers mentioned in (A) above, or
(E) polyamides based on units derived from m-xylylenediamine and adipic acid.

15. A sheet according to claim 1, wherein the polyimide is derived from 4,4'biphenyldianhydride and (4,4'-diaminobiphenyl, or 4,4'-diaminobiphenylether, or phenylenediamine).

16. A sheet according to claim 1, comprising at least one further layer of polymeric material overlying at least one layer of the polyaminde material.

17. A sheet according to claim 1 comprising at least one metallic layer overlying at least one layer of polyamide material.

18. A sheet according to claim 17 comprising the layer of polyimide material having a layer of the polyamide material on one or both of its main surfaces, and a metallic layer on the, or one, or both of the said further layers.

19. A sheet according to claim 1, wherein the polyimide material is capable of retaining at least 50%, preferably at least 75%, more preferably at least 85% of its original elongation after immersion in water of pH10 at 100° C. for 4 days according to ASTM D882.

20. A sheet according to claim 1, wherein the polyimide material is derived from polymerisation of 4,4'-biphenyl dianhydride and p-phenylenediamine.

21. An anisotropically electrically conductive article comprising porous electrically insulating polyimide sheet material at least a selected portion of which has at least 25 substantially non-interconnected pores per square millimeter of its surface, at least a significant proportion of which pores individually contain electrically conductive material which provides an electrically conductive path between, and projects beyond at least one of, the main surfaces of the sheet material, each such conductive path being electrically separate from substantially all the other such conductive paths, and the polyimide being derived from polymerisation of 4,4'-biphenyl dianhydride and (4,4'-diaminobiphenyl, or 4,4'-diaminobiphenylether, or phenylenediamine) and-/or being capable of retaining at least 50%, preferably at least 75%, more preferably at least 85% of its original elongation after immersion in water of pH10 at 100° C. for 4 days according to ASTM D882.

22. An anisotropically electrically conductive article comprising porous electrically insulating polyimide sheet material at least a selected portion of which has at least 25 substantially non-interconnected pores per square millimeter of its surface, at least a significant proportion of which pores are internally plated with electrically conductive material, and the electrically conductive material provides an electrically conductive path between the main surfaces of the sheet material and each such path is electrically separate from substantially all the other such paths, and the polyimide being derived from polymerisation of 4,4'-biphenyl dianhydride and (4,4'-diaminobiphenyl, or 4,4'-diaminobiphenylether, or phenylenediamine) and/or being capable of retaining at least 50%, preferably at least 75%, more preferably at least 85% of its original elongation after immersion in water of pH10 to 100° C. for 4 days according to ASTM D882.

23. An anisotropically electrically conductive article comprising porous electrically insulating polyimide sheet material at least a selected portion of which has a plurality of substantially non-interconnected pores at least a significant proportion of which pores individually contain a tubular first portion of electrically conductive material, which tubular material projects beyond at least one of the main surfaces of the sheet material, and the polyimide being derived from polymerisation of 4,4′-biphenyl dianhydride and (4,4′-diaminobiphenyl, or 4,4′-diaminobiphenylether, or phenylenediamine) and/or being capable of retaining at least 50%, preferably at least 75%, more preferably at least 85% of its original elongation after immersion in water of pH10 at 100° C. for 4 days according to ASTM D882.

24. A sheet or article according to claim 1 having through-holes laser-drilled therein with a hole taper (relative to the hole axis) less than 10°, preferably less than 8°, more preferably less than 6°, and especially less than 4°.

* * * * *